(12) United States Patent
Ueda

(10) Patent No.: US 6,426,303 B1
(45) Date of Patent: *Jul. 30, 2002

(54) PROCESSING SYSTEM

(75) Inventor: Issei Ueda, Kumamoto (JP)

(73) Assignee: Tokyo Electron Limited, Tokyo-To (JP)

( * ) Notice: Subject to any disclaimer, the term of this patent is extended or adjusted under 35 U.S.C. 154(b) by 18 days.

This patent is subject to a terminal disclaimer.

(21) Appl. No.: 09/616,048

(22) Filed: Jul. 13, 2000

(30) Foreign Application Priority Data

Jul. 16, 1999 (JP) .......................................... 11-202894

(51) Int. Cl.[7] .......................................... H01L 81/302
(52) U.S. Cl. ...................... 438/716; 438/908; 438/913; 438/464; 414/925; 414/941; 29/25.01
(58) Field of Search ......................... 29/25.01; 438/464, 438/716, 908, 913; 414/925–941

(56) References Cited

U.S. PATENT DOCUMENTS 5,928,390 A  7/1999  Yaegashi et al. ............ 29/25.01

*Primary Examiner*—Douglas A. Wille
*Assistant Examiner*—Wai-Sing Louie
(74) *Attorney, Agent, or Firm*—Rader, Fishman & Grauer, PLLC

(57) ABSTRACT

When both a wafer transfer means in a first transfer device and a wafer transfer means in a second transfer device move downward at the same time, the amount of exhaust air by an exhaust fan is increased by the control of a control section, whereby the down flow of clean air is intensified. Turbulence of air flow caused when both the wafer transfer means in the first transfer device and the wafer transfer means in the second transfer device move downward at the same time is absorbed by the down flow intensified as described above.

13 Claims, 11 Drawing Sheets

PROCESSING SYSTEM

BACKGROUND OF THE INVENTION

1. Field of the Invention

The present invention relates to a processing system, for example, used for semiconductor device fabrication.

2. Description of the Related Art

In processes of photoresist processing in semiconductor device fabrication, a resist solution is supplied to a substrate such as a semiconductor wafer (hereinafter referred to as "a wafer") to form a resist film, and the resist film is exposed in accordance with a predetermined pattern, and thereafter a developing solution is supplied to the wafer, thereby performing developing processing for the wafer. A coating and developing processing system has been hitherto used to perform such a series of processing.

As an example of the aforesaid coating and developing processing system, structure in which various kinds of processing units such as a resist costing unit for coating the wafer with a resist, a developing processing unit for supplying a developing solution, a heat processing unit, and the like are multi-tired around a vertical transfer-type transfer device for transferring the wafer in a vertical direction is already well known. In such a coating and developing processing system, diffusion of particles is prevented commonly by forming down flow of clean air in the system.

Incidentally, it is thought that a plurality of transfer devices are disposed in the system and processing units are arranged around each transfer device in order to improve processing capacity in the coating and developing processing system structured as above. If the plurality of transfer devices are disposed in the system, however, there is a possibility that the down flow of clean air formed in the system is disturbed, whereby particles are diffused in the system, specially when these transfer devices move downward at the same time. Furthermore, there is a disadvantage that gas containing a lot of particles blown out of these transfer devices during movement gets into the processing units disposed around the transfer devices, thereby causing poor processing.

SUMMARY OF THE INVENTION

The present invention is made to cope with these circumstances, and an object of the present invention is to provide a processing system in which air flow formed therein is never disturbed.

Another object of the present invention is to provided a processing system in which gas containing a lot of particles never gets into processing chambers (units) from transfer devices.

To settle the aforesaid disadvantages, a processing system of the present invention is characterized in that in a processing system comprising a plurality of transfer devices each for transferring a substrate in a vertical direction, air flow in the system is controlled according to movement of the plurality of transfer devices. One aspect thereof is characterized in that downward air flow in the system is intensified when the plurality of transfer devices move downward simultaneously.

In the present invention, since downward air flow in the system is intensified when a plurality of transfer devices move downward simultaneously, for example, downward air flow caused when the plurality of transfer devices move downward simultaneously is absorbed by air flow in the system, whereby air flow formed in the system is no longer disturbed.

A processing system of the present invention is characterized in that in a processing system comprising a plurality of transfer devices each for transferring a substrate in a vertical direction, in which processing chambers each for processing the substrate are disposed around these transfer devices, pressures in the processing chambers are controlled according to movement of the transfer devices. One aspect thereof is characterized in that the pressures in the processing chambers are raised when at least one of the transfer devices moves.

In the present invention, the pressures in the processing chambers are raised when, for example, one transfer device moves, thus eliminating the entry of gas containing a lot of particles blown out of the transfer device during movement of the transfer device into the processing chambers.

A processing system of the present invention is characterized in that in a processing system comprising a plurality of transfer devices each for transferring a substrate in a vertical direction, in which processing chambers each for processing the substrate are disposed around these transfer devices, such control that when at least one of the transfer devices moves, gas in the processing chambers is blown out toward the transfer devices is performed.

In the present invention, such control that when at least one of the transfer devices moves, gas in the processing chambers is blown out toward the transfer devices is performed, thereby eliminating the entry of gas containing a lot of particles blown out of the transfer device during movement of the transfer device into the processing chambers.

In a processing system of the present invention is characterized in that in a processing system comprising a plurality of transfer devices each for transferring a substrate in a vertical direction, in which processing chambers each for processing the substrate are disposed around these transfer devices, shutter members are provided in openings for receiving and sending the substrate from/to the transfer devices, and the opening and closing of the openings by the shutter members are controlled according to movement of the transfer devices. One aspect thereof is characterized in that the openings are closed by the shutter members when the plurality of transfer devices move simultaneously.

In the present invention, the openings provided in the processing chambers are closed by the shutter members when a plurality of transfer devices move simultaneously, thereby eliminating the entry of gas containing a lot of particles blown out of the transfer devices during movement of the transfer devices into the processing chambers. It should be mentioned that the closing of the openings does not cause any trouble in terms of processing since a substrate is not delivered between the transfer devices and the processing chambers when the transfer devices move.

In a processing system of the present invention is characterized in that the processing system structured as above further comprises exhaust means for performing exhausting operation from within the processing chamber, the exhausting operation from within the processing chamber is intensified when the opening is closed by the shutter member, and that the exhausting operation from within the processing chamber is weakened when the opening is opened.

In the present invention, the exhausting operation from within the processing chamber is weakened when the opening is opened, whereby the processing chamber is made positive pressure as compared with the surroundings thereof, thereby eliminating the entry of gas containing particles and the like from the opening into the processing chamber.

A processing system of the present invention is characterized in that in a processing system comprising a plurality of transfer devices each for transferring a substrate in a vertical direction, in which processing chambers each for processing the substrate are disposed around these transfer devices, bypass means for allowing air resulting from a rise in pressure caused by the transfer device moving upward to flow thereinto from an inflow port and exhausting the air from an exhaust port is disposed near the transfer devices.

According to the present invention, even if the pressure in the upper space of the transfer device rises when the transfer device moves upward, part of air is exhausted form the exhaust port via the bypass means. Consequently, the transfer device never causes a rise in pressure, and clean air flows downward in the transfer device and expelled to the outside without being disturbed.

A processing system of the present invention is characterized in that in a processing system comprising a plurality of transfer devices each for transferring a substrate in a vertical direction, in which processing chambers each for processing the substrate are disposed around these transfer devices, a supply apparatus for supplying clean air from a position above the transfer device into the transfer device is provided, and that with reference to the transfer device which is to move downward, such structure that the transfer device which is to move downward is previously detected and the supply apparatus is operated before the transfer device moves downward can be given.

According to the present invention, the transfer device which is to move downward is previously sensed, and the supply apparatus is operated in advance before the transfer device moves downward, whereby the right amount of air can be supplied into the transfer device, thereby eliminating occurrence of turbulence in air flow, and preventing adhesion of fine particles.

These objects and still other objects and advantages of the present invention will become apparent upon reading the following specification when taken in conjunction with the accompanying drawings.

DETAILED DESCRIPTION OF THE PREFERRED EMBODIMENT

Figure 1:
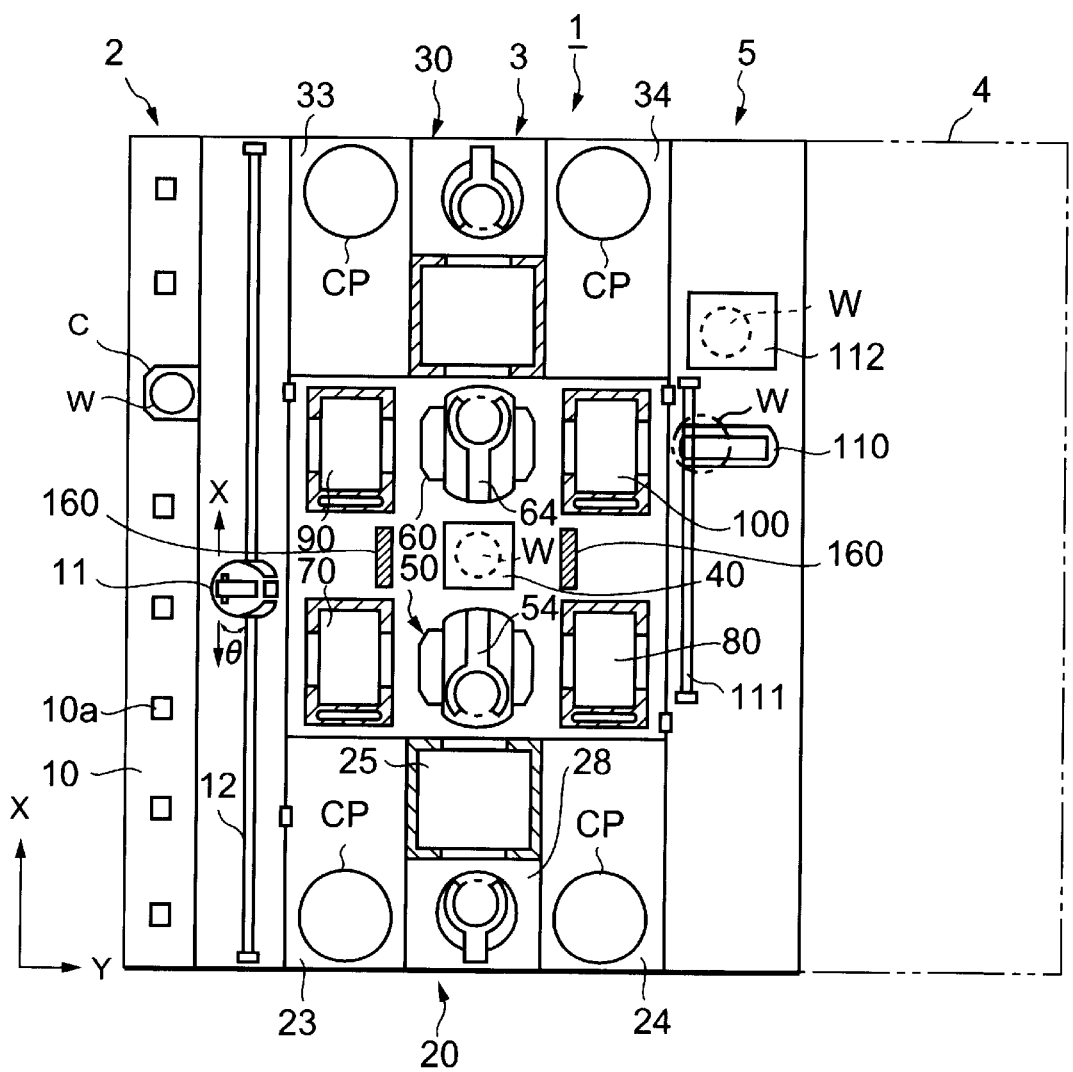
FIG. 1 is a plane view showing the structure of a coating and developing processing system according to an embodiment of the present invention.

A coating and developing processing system 1 has structure in which a cassette station 2 for transferring, for example, 25 wafers W per cassette, as a unit, from/to the outside into/from the coating and developing processing system 1 and carrying the wafer W into/out of a cassette C, a processing station 3 in which various kinds of processing units each for performing predetermined processing for the wafers W one by one in coating and developing processes are multi-tiered, and an interface section 5 for receiving and sending the wafer W from/to an aligner 4 provided adjacent to the processing station 3 are integrally connected.

In the cassette station 2, a plurality of cassettes C can be freely mounted in a line along an X-direction (a vertical direction in FIG. 1) with respective transfer ports for the wafer w facing the processing station 3 side at positions of positioning projections 10a on a cassette mounting table 10. A wafer transfer body 11 movable in the direction of arrangement of the cassettes C (the X-direction) and in the direction of arrangement of the wafers W housed in the cassette C (a Z-direction; vertical direction) is movable along a transfer path 12 to be selectively accessible to each of the cassettes C.

The wafer transfer body 11 is also structured to be rotatable in a θ-direction so as to be accessible to alignment units 71 and extension units 72 included in a first thermal processing unit group 70 and a third thermal processing unit group 90 both of which will be described later.

In the processing station 3, a resist and antireflection film coating unit group 20 is disposed at the front thereof, and a developing processing unit group 30 is disposed at the back thereof. It is naturally suitable to dispose the developing processing unit group 30 at the front and the resist and antireflection film coating unit group 20 at the back.

Figure 2:
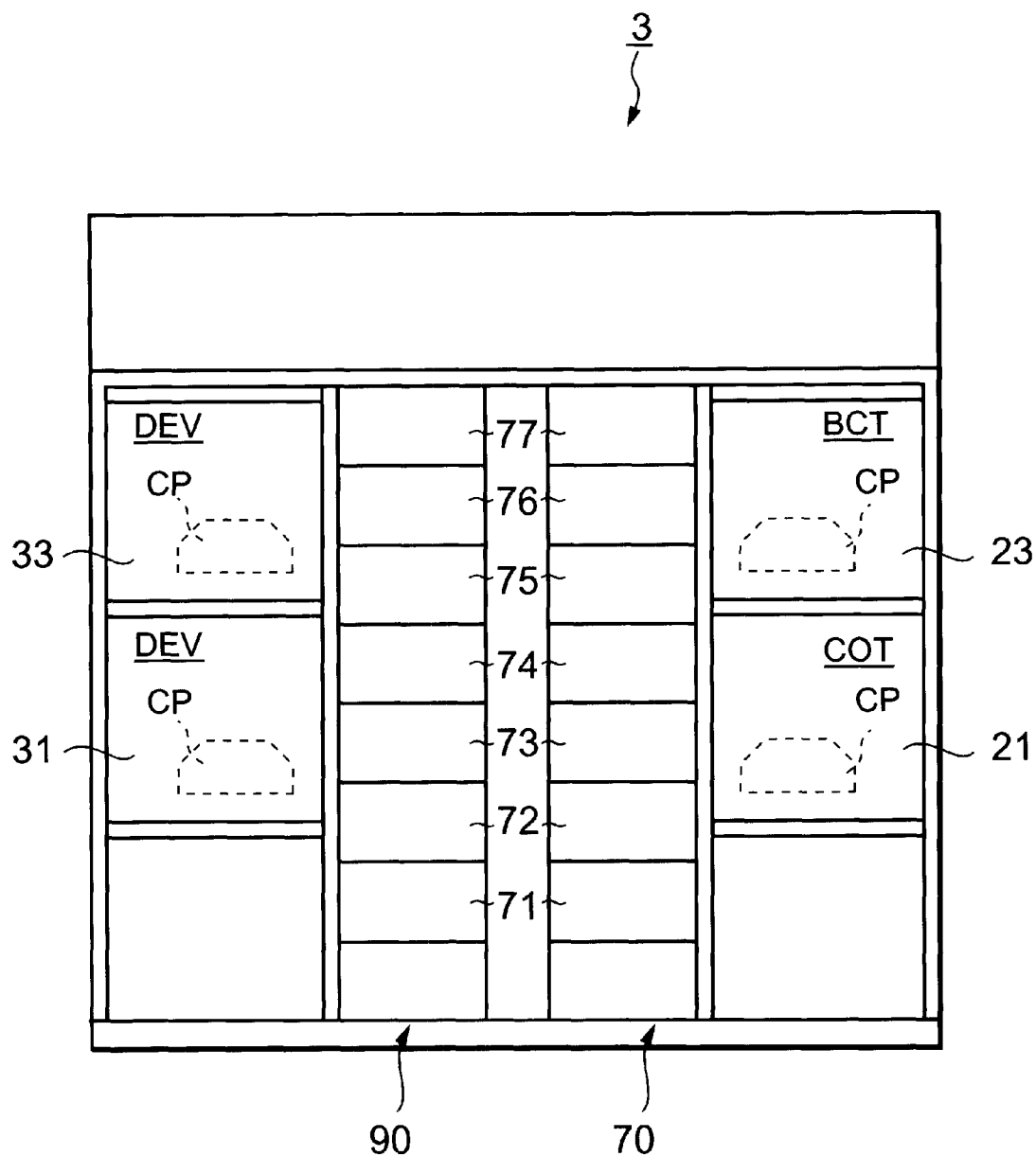
FIG. 2 is a left side view of a processing station in the coating and developing processing system shown in FIG. 1.
Figure 3:
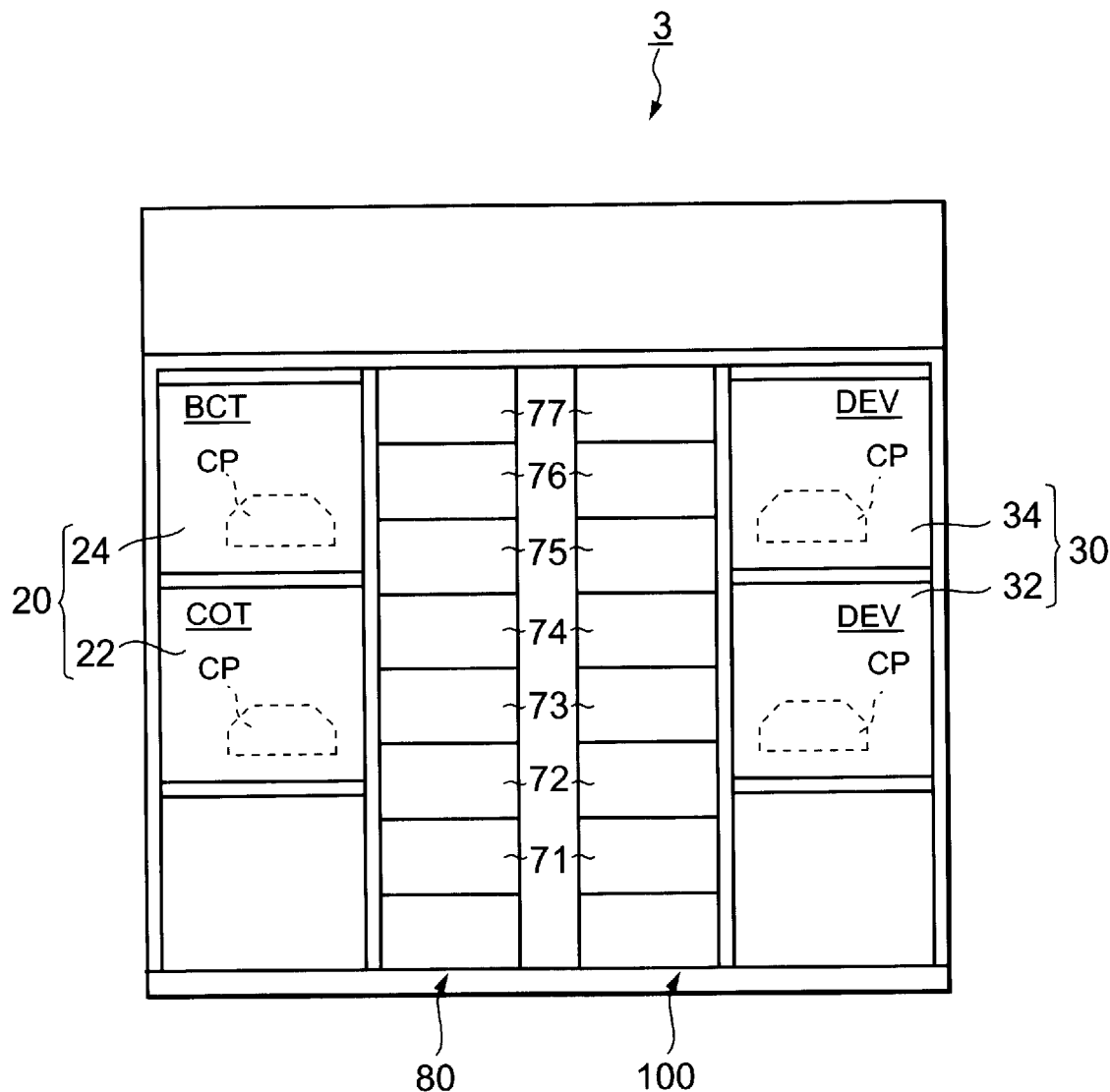
FIG. 3 is a right side view of the processing station in the coating and developing processing system shown in FIG. 1.

As shown in FIG. 2 and FIG. 3, in the resist and antireflection film coating unit group 20, resist coating units 21 and 22 each for performing resist coating processing for the wafer W by mounting the wafer W on a spin chuck and applying a resist solution to the wafer W in a cup CP are arranged side by side, and antireflection film coating units 23 and 24 each for performing antireflection film coating processing for the aforesaid wafer W by mounting the wafer W on a spin chuck and applying an antireflection film onto the wafer W in a cup CP are arranged side by side on top of the resist coating units 21 and 22.

Figure 4:
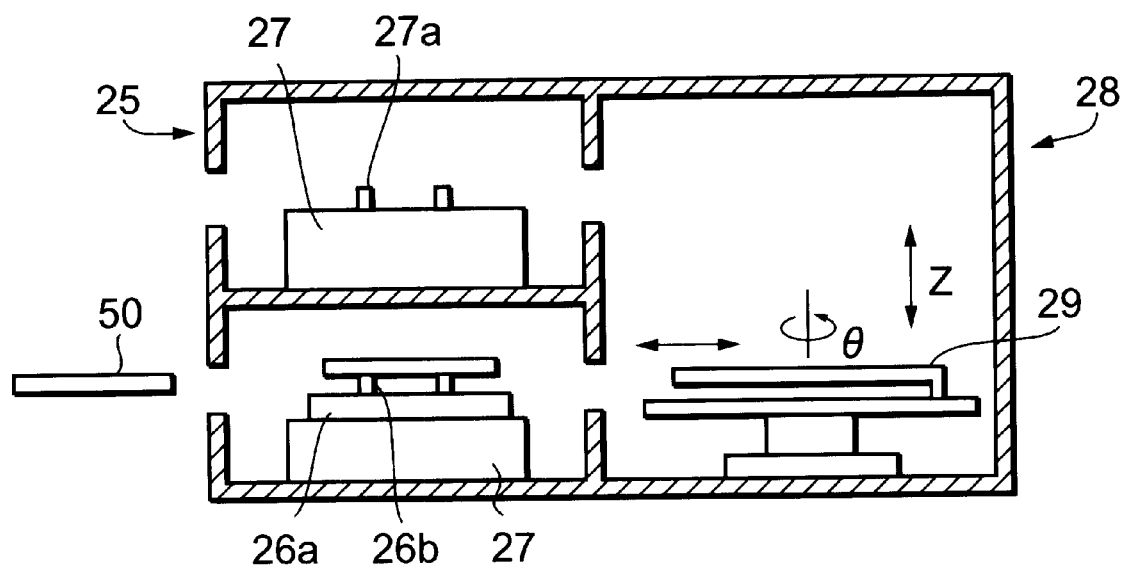
FIG. 4 is a diagram showing the structure of a delivery section and an intermediary transfer section of a resist and antireflection film coating unit group in the coating and developing processing system shown in FIG. 1.

A delivery section 25 and an intermediary transfer section 28 are disposed between the resist coating units 21 and 22 (the antireflection film coating units 23 and 24) arranged side by side. As shown in FIG. 4. in the delivery section 25, a temperature regulating table 26 for regulating the temperature of the wafer W at 23° C. is disposed at the lower tier, and a mounting table 27 is disposed at the upper tier. In the temperature regulating table 26, a plurality of supporting pins 26b are disposed to be able to protrude from and retract into the front face of a chill plate 26a in which cooling means (not illustrated) such as a Peltier element or the like is embedded. In the mounting table 27, a plurality of fixed supporting pins 27a are disposed on the front face thereof. The intermediary transfer section 28 has a transfer arm 29 which is freely movable forward to and backward from the temperature regulating table 26 and the mounting table 27 in the delivery section 25, the resist coating units 21 and 22, and the antireflection film coating units 23 and 24, rotatable in the θ-direction, and ascendable and descendable in the Z-direction by a drive system the illustration of which is omitted so as to receive and send the wafer from/to these tables and units.

The wafer W is delivered to the temperature regulating table 26 from a first transfer device 50 which will be described later, and then the transfer arm 29 delivers the wafer W to any of the resist coating units 21 and 22 and the antireflection film coating units 23 and 24, thereafter receives the wafer W coated with the resist or antireflection film from any of the resist coating units 21 and 22 and the antireflection film coating units 23 and 24, and places it on the mounting table 27. The first transfer device 50 receives this wafer W.

Since the wafer W is delivered to the resist coating units 21 and 22 and the antireflection film coating units 23 and 24 via the temperature regulating table 26 disposed in the resist and antireflection film coating unit group 20 without being delivered directly from the first transfer device 50 to the resist coating unit and the like as described above, resist coating and antireflection film coating can be performed while the temperature of the wafer W is regulated at a more precise temperature, thereby reducing entry of particles into the resist coating units 21 and 22 and the antireflection film coating units 23 and 24 from the first transfer device 50 side.

The developing processing unit group 30 is also structured likewise with the resist and antireflection film coating unit group 20. Specifically, in the developing processing unit group 30, developing processing units 31 and 32 each for performing developing processing for the wafer W by mounting the wafer W on a spin chuck and applying a developing solution to the wafer W in a cup CP are arranged side by side, and developing processing units 33 and 34 are piled on top of the developing processing units 31 and 32.

A delivery section 35 and an intermediary transfer section 38 are disposed between the developing processing units 31 and 32 (33 and 34) arranged side by side. The structure of the delivery section 35 and the intermediary transfer section 38 is the same as the one shown in FIG. 4, and therefore the explanation thereof is omitted. Also in this case, developing processing can be performed while the temperature of the wafer W is regulated at a more precise temperature, thereby reducing entry of particles into the developing processing units 31, 32, 33 and 34 from a second transfer device 60 side.

As shown in FIG. 1, a delivery table 40 on which the wafer W can be freely mounted in the middle of the processing station 3. The delivery table 40 may have multi-tiered structure.

The resist and antireflection film coating unit group 20 and the developing processing unit group 30 face each other across the delivery table 40, the first transfer device 50 is provided between the resist and antireflection film coating unit group 20 and the delivery table 40, and the second transfer device 60 is provided between the developing processing unit group 30 and the delivery table 40.

Figure 5:
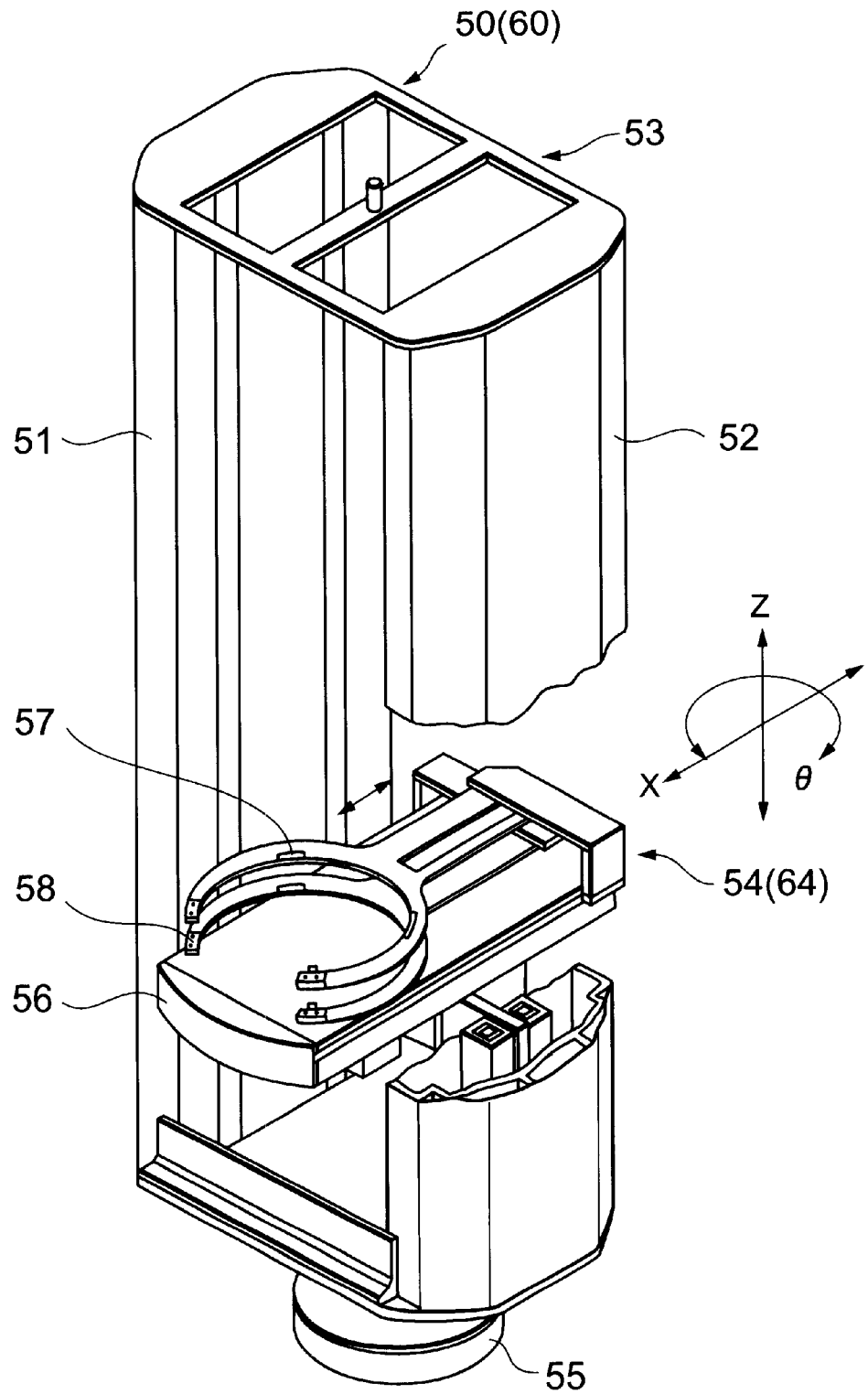
FIG. 5 is a perspective view showing the structure of a first transfer device in the coating and developing processing system shown in FIG. 1.

The first transfer device 50 and the second transfer device 60 have basically the same structure, and the structure of the first transfer device 50 will be explained based on FIG. 5.

The first transfer device 50 is provided with a wafer transfer means 54 (64) which is ascendable and descendable in the vertical direction (the Z-direction) inside a cylindrical supporter 53 composed of a pair of wall portions 51 and 52 which are connected to each other at respective upper ends and lower ends and face each other. The cylindrical supporter 53 is connected to a rotating shaft of a motor 55 and rotated integrally with the wafer transfer means 54 around the rotating shaft by rotational driving force of the motor 55. Accordingly, the wafer transfer means 54 is rotatable in the θ-direction.

A plurality of, for example, two tweezers 57 and 58 each for holding the wafer W are vertically provided on a transfer base 56 of the wafer transfer means 54. The tweezers 57 and 58 have basically the same structure and each have a shape and a size capable of freely passing through a side opening between both the wall portions 51 and 52 of the cylindrical supporter 53. Each of the tweezers 57 and 58 is freely movable in a forward and a backward direction by a motor (not illustrated) contained in the transfer base 56.

Thermal processing unit groups are disposed on both sides of the first transfer device 50 and the second transfer device 60. The thermal processing unit groups include a first thermal processing unit group 70, a second thermal processing unit group 80, a third thermal processing unit group 90, and a fourth thermal processing unit group 100. The first thermal processing unit group 70 and the third thermal processing unit group 90 are arranged on the cassette station 2 side, and the second thermal processing unit group 80 and the fourth thermal processing unit group 100 are arranged on the interface section 5 side.

In each of the thermal processing unit groups 70, 80, 90, and 100, an alignment unit 71 for aligning the wafer W, an extension unit 72 for making the wafer W wait, and heat processing units 73 to 77 are, for example, seven-tiered from the bottom in order.

In the interface section 5, a wafer transfer body 110 for transferring the wafer W is provided. The wafer transfer body 110 is movable in the X-direction along a transfer rail 111 and in the Z-direction (the vertical direction) and rotatable in the θ-direction, and structured to be able to transfer the wafer W between the aligner 4, the extension units 72 included in the second thermal processing unit group 80 and the fourth thermal processing unit group 100, and a peripheral aligner 112 for exposing the peripheral edge portion of the wafer W.

Figure 6:
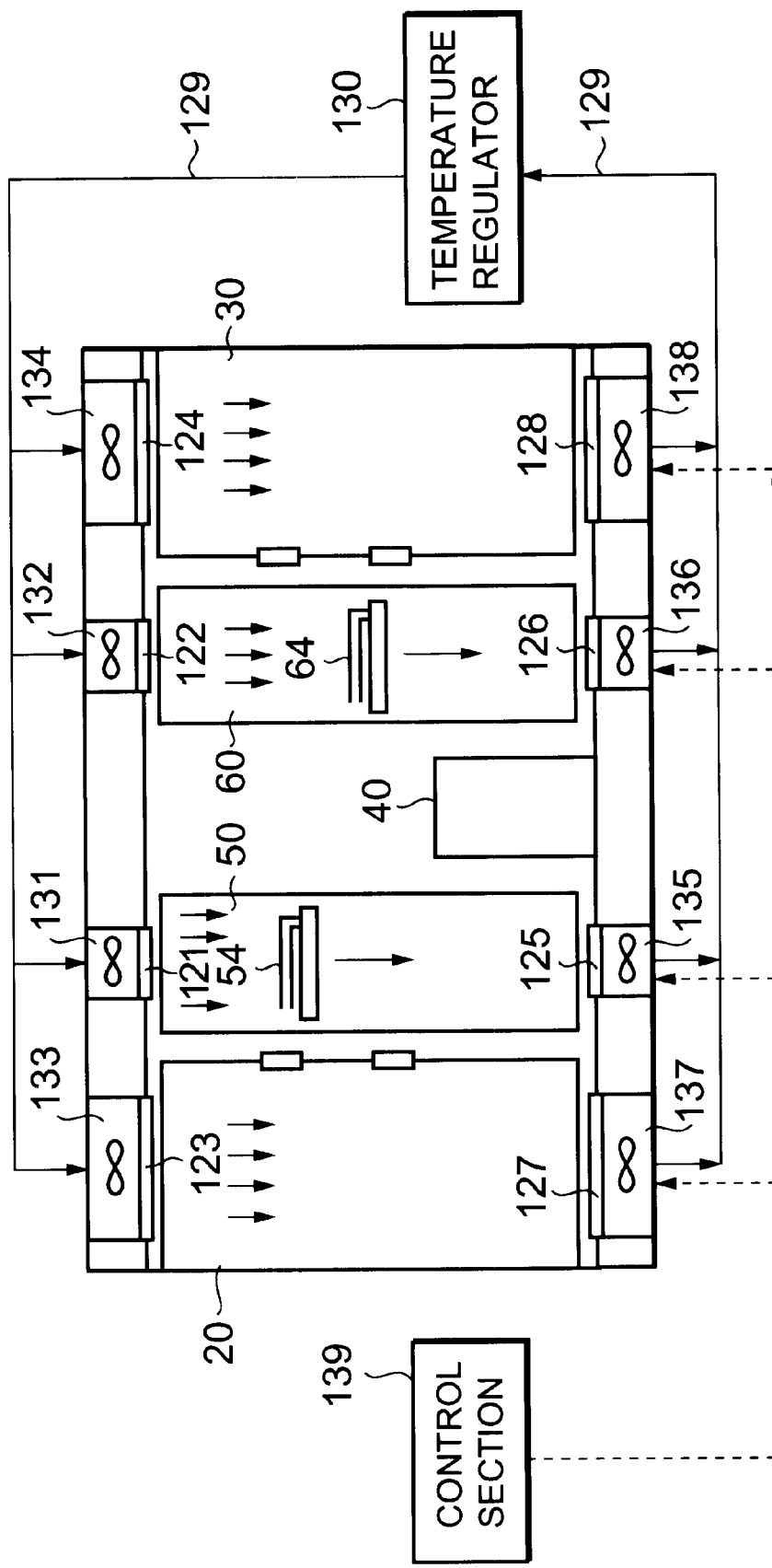
FIG. 6 is a diagram showing the structure of a clean air supply system in the coating and developing processing system according to the embodiment of the present invention.

FIG. 6 is a diagram showing the structure of a clean air supply system in the coating and developing processing system 1 structured as above.

As shown in FIG. 6, supply ports 121 to 124 for introducing clean air into the system are provided at the top of the coating and developing processing system 1, and exhaust ports 125 to 128 for exhausting clean air to the outside of the system are provided at the bottom of the coating and developing processing system 1. The supply ports 121 to 124 and the exhaust ports 125 to 128, for example, are provided correspondingly to areas accordant with the kinds of processing. In this case, the supply port 121 and the exhaust port 125 are provided at positions corresponding to the first transfer device 50, the supply port 122 and the exhaust port 126 are provided at positions corresponding to the second transfer device 60, the supply port 123 and the exhaust port 127 are provided at positions corresponding to the resist and antireflection film coating unit group 20, and the supply port 124 and the exhaust port 128 are provided at positions corresponding to the developing processing unit group 30.

The supply ports 121 to 124 and the exhaust ports 125 to 128 are connected by means of a pipe line 129 for air circulation, and a temperature regulator 130 is disposed in the pipe line 129. Fan filter units 131 to 134 are disposed at the supply ports 121 to 124 respectively, and exhaust fans 135 to 138 are disposed at the exhaust ports 125 to 128 respectively. The control of the amounts of exhaust air by the exhaust fans 135 to 138 is performed by a control section 139.

Clean air supplied from the supply ports 121 to 124 into the system 1 forms down flow in the system 1, and is exhausted from the exhaust ports 125 to 128 to the outside of the system 1. Then, the temperature control and cleaning of the clean air are performed passing through the pipe line 129, and the clean air is supplied again from the supply ports 121 to 124 into the system 1.

In this embodiment, when both the wafer transfer means 54 in the first transfer device 50 and the wafer transfer means 64 in the second transfer device 60 move downward at the same time, the amounts of exhaust air by the exhaust fans 135 and 136 are increased by the control of the control section 139, whereby the down flow of the clean air is intensified.

Accordingly, in the system 1 of this embodiment, turbulence of air flow caused when both the wafer transfer means 54 in the first transfer device 50 and the wafer transfer means 64 in the second transfer device 60 move downward at the same time is absorbed by the down flow intensified as described above. Thus, particles are expelled from the exhaust ports 125 and 126 without diffusing in the system 1.

Next, another embodiment of the present invention will be explained.

Figure 7:
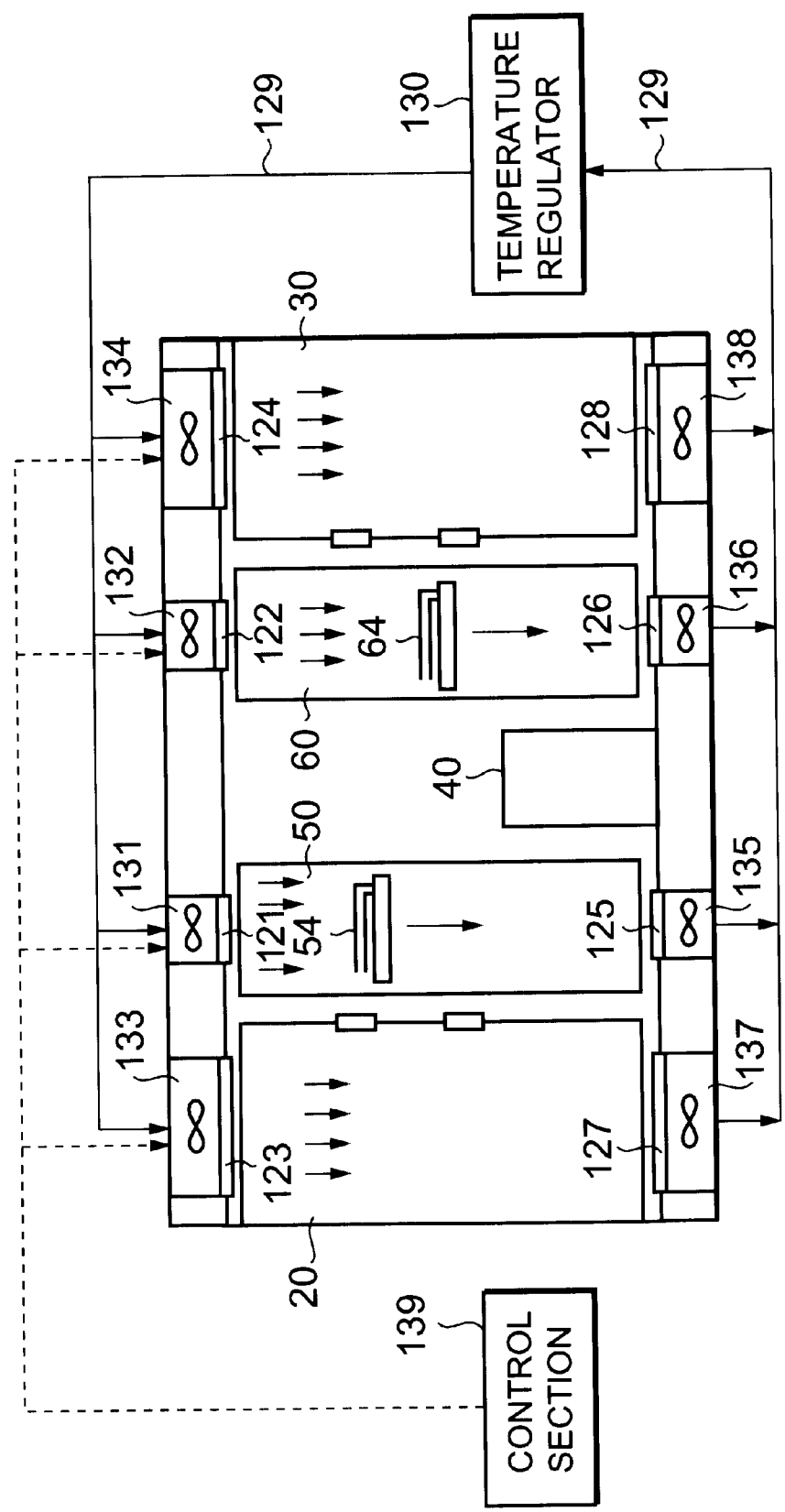
FIG. 7 is a diagram showing the structure of a clean air supply system in a coating and developing processing system according to another embodiment of the present invention.

FIG. 7 is a diagram showing the structure of a clean air supply system according to this embodiment.

In the clean air supply system shown in FIG. 7, the control section 139 controls the amounts of clean air introduced into the system 1 by the fan filter unit 133 corresponding to the resist and antireflection film coating unit group 20 and the fan filter unit 134 corresponding to the developing processing unit group 30.

In this embodiment, when the wafer transfer means 54 in the first transfer device 50 and/or the wafer transfer means 64 in the second transfer device 60 move, the control section 139 performs such control that the amounts of clean air introduced into the system 1 by the fan filter unit 133 corresponding to the resist and antireflection film coating unit group 20 and the fan filter unit 134 corresponding to the developing processing unit group 30 are increased, whereby the pressures in the resist and antireflection film coating unit group 20 and the developing processing unit group 30 are higher as compared with those in other areas where the first transfer device 50, the second transfer device 60, and the like are disposed.

Hence, in this embodiment, particles caused when the wafer transfer means 54 in the first transfer device 50 and/or the wafer transfer means 64 in the second transfer device 60 moves never enter the resist and antireflection film coating unit group 20 nor the developing processing unit group 30. As a result, processing in these resist and antireflection film coating unit group 20 and developing processing unit group 30 can be performed normally.

Next, still another embodiment of the present invention will be explained.

Figure 8:
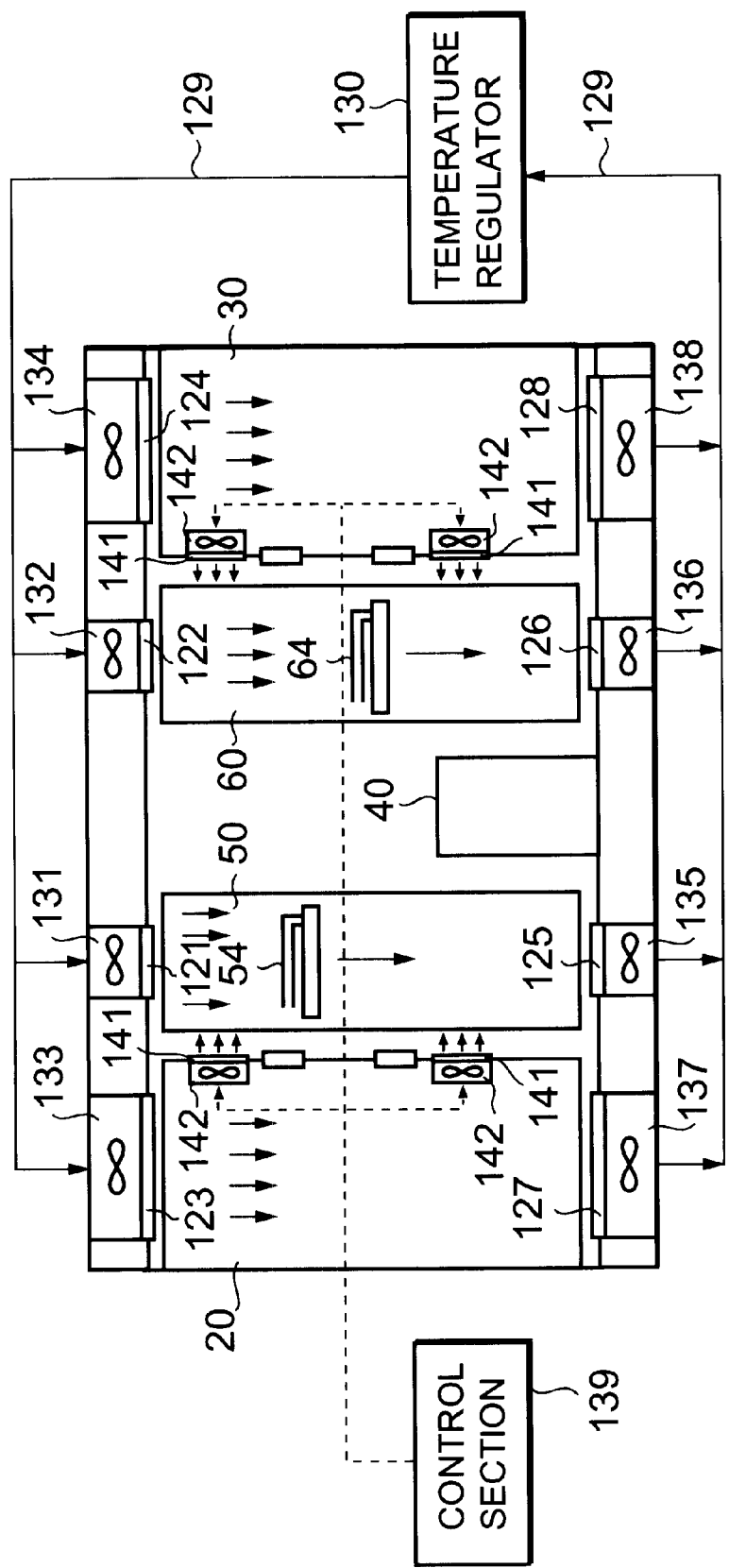
FIG. 8 is a diagram showing the structure of a clean air supply system in a coating and developing processing system according to still another embodiment of the present invention.

FIG. 8 is a diagram showing the structure of a clean air supply system according to this embodiment.

In the clean air supply system shown in FIG. 8, exhaust ports 141 and exhaust fans 142 for exhausting air toward the first transfer device 50 and the second transfer device 60 are provided in the resist and antireflection film coating unit group 20 and the developing processing unit group 30. The operation of the exhaust fans 142 is controlled by the control section 139.

In this embodiment, when the wafer transfer means 54 in the first transfer device 50 and/or the wafer transfer means 64 in the second transfer device 60 moves, the exhaust fans 142 are operated by the control of the control section 139, and air is exhausted from the resist and antireflection film unit group 20 and the developing processing unit group 30 toward the first transfer device 50 and the second transfer device 60.

Thus, in this embodiment, particles caused when the wafer transfer means 54 in the first transfer device 50 and/or the wafer transfer means 64 in the second transfer device 60 moves never enter the resist and antireflection film coating unit group 20 nor the developing processing unit 30. As a result, processing in these resist and antireflection film coating unit group 20 and developing processing unit group 30 can be performed normally.

Next, yet another embodiment of the present invention will be explained.

Figure 9:
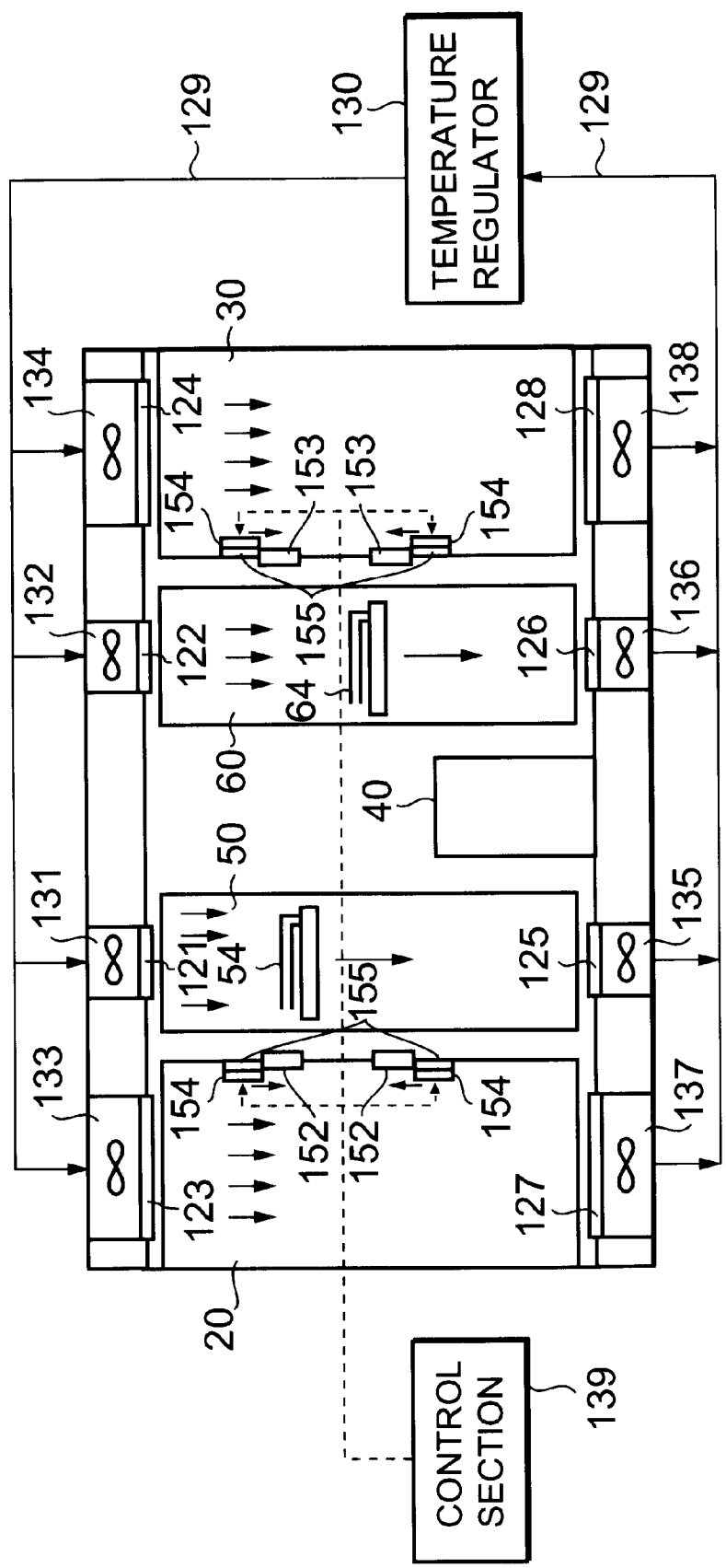
FIG. 9 is a diagram showing the structure of a clean air supply system in a coating and developing processing system according to yet another embodiment of the present invention.

FIG. 9 is a diagram showing the structure of a system according to this embodiment.

In the system 1 shown in FIG. 9, provided in openings 152 for receiving and sending the wafer W from/to the first transfer device 50 in the resist and antireflection film coating unit group 20, and openings 153 for receiving and sending the wafer W from/to the second transfer device 60 in the developing processing unit group 30 are shutter members 154 and shutter opening and closing mechanisms 155 each for opening and closing the openings. The operation of the shutter opening and closing mechanisms 155 is controlled by the control section 139.

In this embodiment, when the wafer transfer means 54 in the first transfer device 50 and the wafer transfer means 64 in the second transfer device 60 move simultaneously, the wafer W is not delivered between the first transfer device 50 and the second transfer device 60, and the resist and antireflection film coating unit group 20 and the developing processing unit group 30, and therefore the openings 152 and 153 are closed by the shutter members 154 by the control of the control section 139.

Accordingly, in this embodiment, particles caused when the wafer transfer means 54 in the first transfer device 50 and the wafer transfer means 64 in the second transfer device 60 move simultaneously never enter the resist and antireflection film coating unit group 20 nor the developing processing unit group 30. As a result, processing in these resist and antireflection film coating unit group 20 and developing processing unit group 30 can be performed normally.

In this case, it is also suitable that the system is structured so that the amounts of air exhausted by the exhaust fans 137 and 138 corresponding to the resist and antireflection film coating unit group 20 and the developing processing unit group 30 can be controlled by the control section 139, and that the amounts of exhaust air by the exhaust fans 137 and 138 are increased when the openings 152 and 153 are closed by the shutter members 154 and that the amounts of exhaust air by the exhaust fans 137 and 138 are decreased when the openings 152 and 153 are opened.

Consequently, when the openings 152 and 153 are opened, the pressures in the resist and antireflection film coating unit group 20 and the developing processing unit group 30 are made positive pressures as compared with the surroundings thereof, and thus the entry of gas containing particles and the like into the resist and antireflection film coating unit group 20 and the developing processing unit group 30 from the openings 152 and 153 is eliminated.

Figure 10:
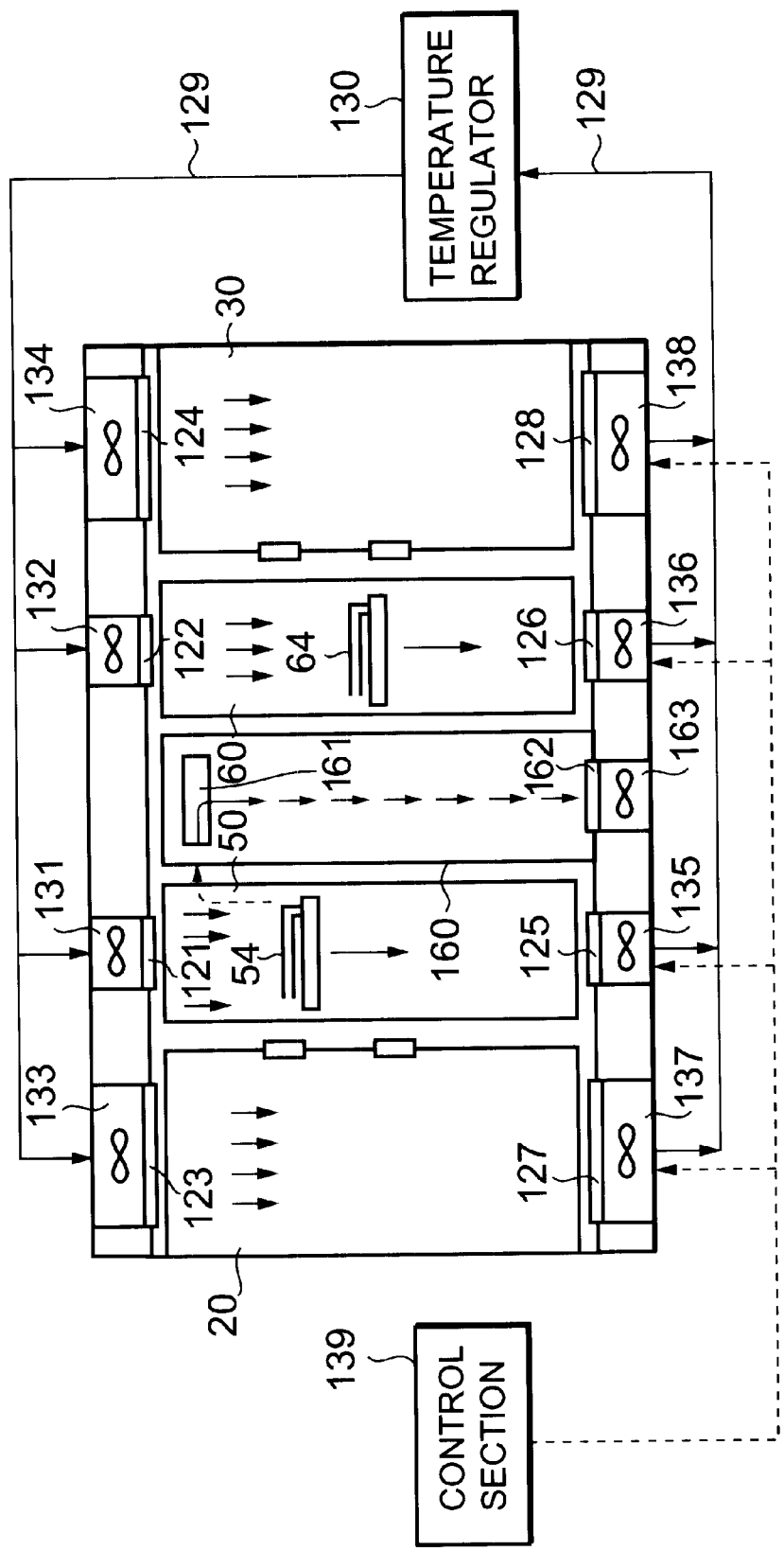
FIG. 10 is a diagram showing the structure of a clean air supply system in a coating and developing processing system according to another embodiment of the present invention.
Figure 11:
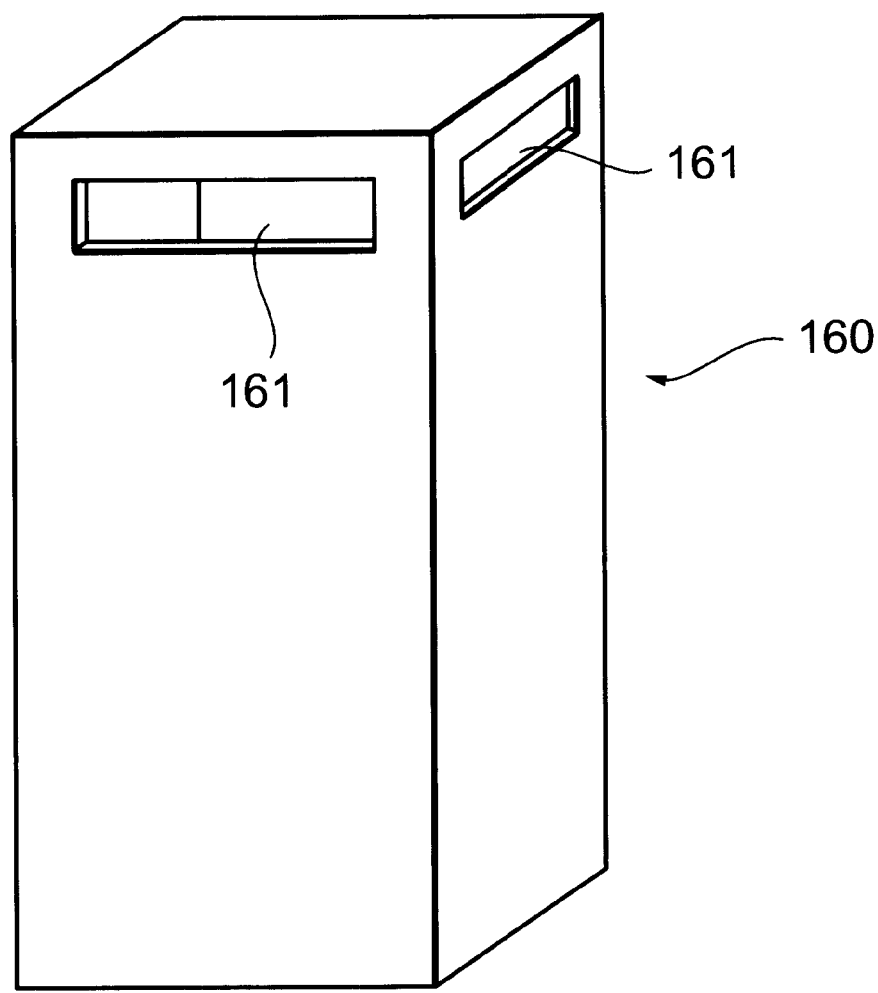
FIG. 11 is an external perspective view of a duct.

Next, another embodiment according to the clean air supply system will be explained with reference to FIG. 1, FIG. 10, and FIG. 11. The structure of this embodiment differs from that of the embodiment shown in FIG. 6 in that a pair of ducts 160 as bypass means are provided between the first transfer device 50 and the second transfer device 60 or in the vicinity of these transfer devices 50 and 60. The duct 160 is formed in the shape of a box, and provided with inflow ports 161 in the upper portion of each face and an exhaust port 162 at the bottom thereof.

An exhaust means for controlling the strength of operation of the exhaust fan 163 by the control section is provided in the exhaust port 162.

When at least either one of the transfer devices moves upward, the control section 139 operates the exhaust fan 163 in response, thereby exhausting air in the duct 160. The control section 139 performs such control that the amount of exhaust air by the exhaust fan 163 is decreased when one transfer device is operated, and that the exhaust fan's strength is intensified in order to increase the amount of exhaust air when two of the transfer devices operate at the same time.

Since the ducts 160 being bypass means are provided near the transfer devices 50 and 60 as described above, part of air flows into the ducts 160 from the inflow ports 161 and is exhausted through the exhaust port 162, thus avoiding a rise in pressure.

On this occasion, the strength of the exhaust fan 163 is controlled by the control section 139 according to the operating states of the wafer transfer means 54 and 64 of the transfer devices 50 and 60.

Owing to the aforesaid structure, a rise in the pressure in the first transfer device 50 or the second transfer device 60 can be avoided, and thus not only the rising operation of the wafer transfer means 54 and 65 is smoothened, but also the occurrence of turbulence in downward air flowing into the exhaust fan 162 is eliminated. As a result, fine particles are exhausted to the outside from the exhaust ports 125 and 126 without diffusing in the system. Simultaneously with this, the entry of particles into the resist and antireflection film coating unit group 20 or the developing processing unit group 30 can be effectively prevented.

Incidentally, the number of the inflow ports 161 is optional. This inflow port 161 may be formed so as to be always opened, or can be formed so as to be opened only when the wafer transfer means 54 and 64 rise and be closed except the above situation.

In still another embodiment, in a processing system in which processing chambers each for processing a substrate are disposed around these transfer devices, a supply apparatus for supplying clean air from a position above the transfer device into the transfer device is provided, and with reference to the transfer device which is to move downward, such structure that the transfer device which is to move downward is previously detected and the supply apparatus is operated so that clean air starts to flow downward before the transfer device moves downward can be given.

Such structure enables clean air to flow uniformly in spaces in the transfer devices 50 and 60, whereby fine particles such as particles and the like can be expelled to the outside more efficiently.

Such structure can be applied also to the aforesaid embodiments shown in FIG. 7 to FIG. 9.

Incidentally, although the aforesaid embodiments are explained with the examples in which the wafer is used as a substrate, the present invention can be applied to other substrates such as an LCD substrate and the like.

As explained above, according to the present invention, air flow formed in the system is never disturbed, or gas containing a lot of particles never enters from the transfer devices into the processing chambers (units), and thus processing in the processing chambers can be performed normally.

The aforesaid embodiments have the intention of clarifying technical meaning of the present invention. Therefore, the present invention is not intended to be limited to the above concrete embodiments and to be interpreted in a narrow sense, and various changes may be made therein without departing from the spirit of the present invention and within the meaning of the claims.

What is claimed is:

1. A processing system, comprising:

a plurality of transfer devices each for transferring a substrate in a vertical direction; and means for controlling air flow in said system according to movement of said plurality of transfer devices.

2. The system as set forth in claim 1, wherein said control means intensifies downward air flow in said system when said plurality of transfer devices move downward simultaneously.

3. A processing system, comprising:

a plurality of transfer devices each for transferring a substrate in a vertical direction;

processing chambers, disposed around said transfer devices, each for processing the substrate; and means for controlling pressures in said processing chambers according to movement of said transfer devices.

4. The system as set forth in claim 3, wherein said control means raises the pressures in said processing chambers when at least one of said transfer devices moves.

5. A processing system, comprising:

a plurality of transfer devices each for transferring a substrate in a vertical direction;

processing chambers, disposed around said transfer devices, each for processing the substrate; and means for performing such control that when at least one of said transfer devices moves, gas in said processing chambers is blown out toward said transfer devices.

6. A processing system, comprising:

a plurality of transfer devices each for transferring a substrate in a vertical direction;

processing chambers disposed around said transfer devices and having openings for receiving and sending the substrate from/to said transfer devices, each for processing the substrate;

shutter members provided at the openings;

means for controlling the opening and closing of the openings by said shutter members according to movement of said transfer devices.

7. The system as set forth in claim 6, wherein said control means closes the openings by said shutter members when said plurality of transfer devices move simultaneously.

8. The system as set forth in claim 6, further comprising:

exhaust means for performing exhausting operation from within said processing chamber; and means for performing such control that the exhausting operation from within said processing chamber is intensified when the opening is closed by said shutter member, and that the exhausting operation from within said processing chamber is weakened when the opening is opened.

9. A processing system, comprising:

a plurality of transfer devices each for transferring a substrate in a vertical direction;

processing chambers, disposed around said transfer devices, each for processing the substrate; and bypass means, disposed near said transfer devices, for allowing air resulting from a rise in pressure caused by said transfer device moving upward to flow thereinto from an inflow port and exhausting the air from an exhaust port.

10. The system as set forth in claim 9, further comprising:

exhaust means provided at the exhaust port;

means for performing such control that exhausting operation by said exhaust means is weakened when the number of said transfer devices to be operated is small and that exhausting operation by said exhaust means is intensified when the number of said transfer devices to be operated is large.

11. The system as set forth in claim 10, wherein said bypass means has a box-shaped duct, and wherein the inflow port is provided in the upper portion of the duct.

12. The system as set forth in claim 11, wherein the inflow ports are provided in the periphery of the duct and at a plurality of positions.

13. A processing system, comprising:

a plurality of transfer devices each for transferring a substrate in a vertical direction;

processing chambers, disposed around said transfer devices, each for processing the substrate;

a supply apparatus for supplying clean air from a position above said transfer device into said transfer device; and means for performing such control that with reference to said transfer device which is to move downward, said transfer device which is to move downward is previously detected, and that said supply apparatus is operated before said transfer device moves downward.

\* \* \* \* \*